(12) United States Patent
Bando

(10) Patent No.: US 9,947,846 B2
(45) Date of Patent: Apr. 17, 2018

(54) LIGHT EMITTING DEVICE HAVING A REFLECTING MEMBER AND METHOD OF MANUFACTURING THE SAME

(71) Applicant: NICHIA CORPORATION, Anan-shi, Tokushima (JP)

(72) Inventor: Yoichi Bando, Anan-shi (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 15/280,535

(22) Filed: Sep. 29, 2016

(65) Prior Publication Data

US 2017/0092825 A1 Mar. 30, 2017

(30) Foreign Application Priority Data

Sep. 30, 2015 (JP) .................. 2015-192741

(51) Int. Cl.
*H01L 33/50* (2010.01)
*H01L 33/60* (2010.01)
*H01L 33/38* (2010.01)
*H01L 33/62* (2010.01)

(52) U.S. Cl.
CPC .............. *H01L 33/60* (2013.01); *H01L 33/38* (2013.01); *H01L 33/50* (2013.01); *H01L 33/507* (2013.01); *H01L 33/62* (2013.01); *H01L 2933/0041* (2013.01); *H01L 2933/0058* (2013.01)

(58) Field of Classification Search
CPC ....... H01L 33/388; H01L 33/50; H01L 33/60; H01L 33/62
See application file for complete search history.

(56) References Cited

U.S. PATENT DOCUMENTS

| | | | |
|---|---|---|---|
| 2010/0163898 A1* | 7/2010 | Hung | H01L 33/507 257/98 |
| 2010/0264438 A1* | 10/2010 | Suenaga | H01L 33/58 257/98 |
| 2012/0012875 A1 | 1/2012 | Ooyabu et al. | |
| 2012/0025247 A1 | 2/2012 | Ooyabu et al. | |
| 2012/0235169 A1 | 9/2012 | Seko et al. | |
| 2012/0261700 A1 | 10/2012 | Ooyabu et al. | |

(Continued)

FOREIGN PATENT DOCUMENTS

| | | |
|---|---|---|
| JP | 2010-219324 A | 9/2010 |
| JP | 2010-283281 A | 12/2010 |

(Continued)

*Primary Examiner* — Kyoung Lee
*Assistant Examiner* — Christina Sylvia
(74) *Attorney, Agent, or Firm* — Foley & Lardner LLP

(57) ABSTRACT

A method of manufacturing a light emitting device includes providing a reflecting sheet having a first surface and a second surface and defining through-holes; placing a wavelength-converting sheet on a first surface side of the reflecting sheet to cover openings of the through-holes at the first surface side; disposing a light-transmissive adhesive in the through-holes; disposing a light emitting element in each of the through-holes so that a light emitting surface of the light emitting element faces the wavelength converting sheet; fixing the light emitting element in the through-hole via the adhesive; and covering the second surface of the reflecting sheet and an outer surface of the adhesive with a reflecting material.

19 Claims, 11 Drawing Sheets

(56) References Cited

U.S. PATENT DOCUMENTS

| | | | | |
|---|---|---|---|---|
| 2012/0262054 A1* | 10/2012 | Ooyabu | ............... | H01L 33/56 313/498 |
| 2013/0000712 A1* | 1/2013 | Shih | ............... | H01L 31/02008 136/256 |
| 2014/0175482 A1* | 6/2014 | Jang | ............... | H01L 33/60 257/98 |
| 2015/0194578 A1 | 7/2015 | Imai | | |
| 2016/0093781 A1* | 3/2016 | Tamaki | ............... | H01L 33/505 257/98 |
| 2017/0025572 A1* | 1/2017 | Shichijo | ............... | H01L 33/20 |
| 2017/0062671 A1* | 3/2017 | Hashimoto | ......... | H01L 33/507 |

FOREIGN PATENT DOCUMENTS

| | | |
|---|---|---|
| JP | 2012-023288 A | 2/2012 |
| JP | 2012-028666 A | 2/2012 |
| JP | 2012-059939 A | 3/2012 |
| JP | 2012-222317 A | 11/2012 |
| JP | 2012-222319 A | 11/2012 |
| JP | 2012-227470 A | 11/2012 |
| JP | 2013-012544 A | 1/2013 |
| JP | 2013-012545 A | 1/2013 |
| JP | 2013-069765 A | 4/2013 |
| JP | 2013-077679 A | 4/2013 |
| JP | 2013-219397 A | 10/2013 |
| JP | 2014-072213 A | 4/2014 |
| JP | 2015-109484 A | 6/2015 |
| JP | 2015-173287 A | 10/2015 |

\* cited by examiner

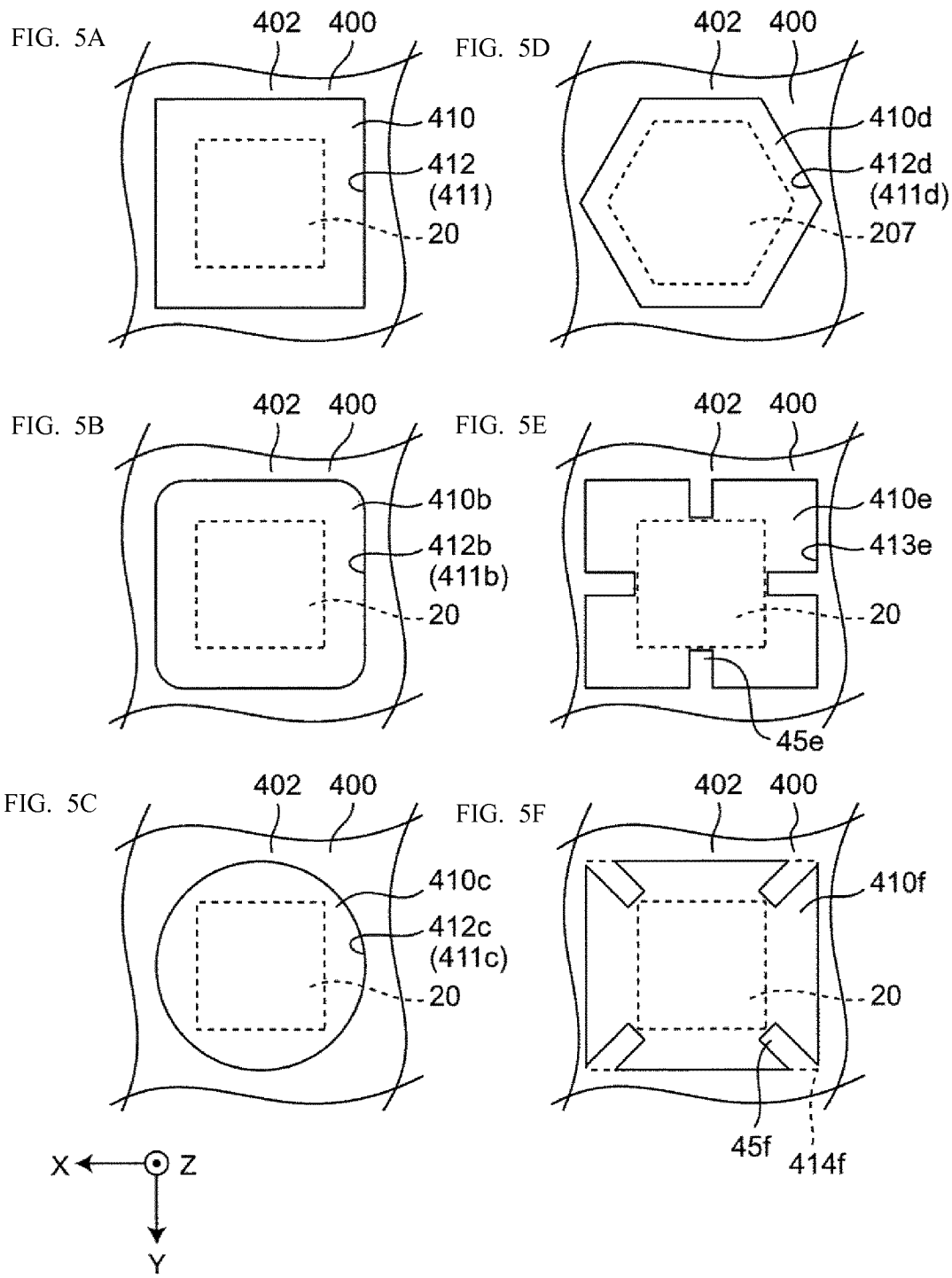

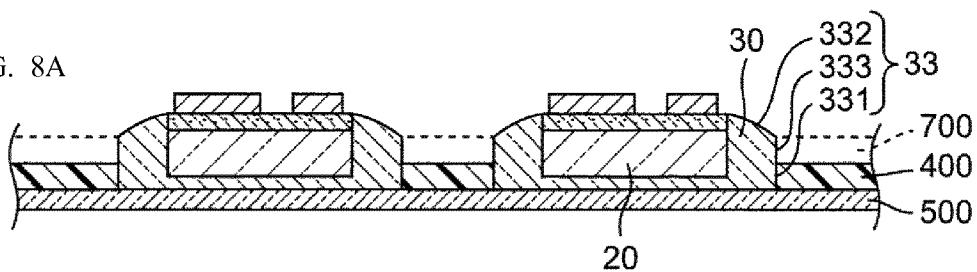
FIG. 8A
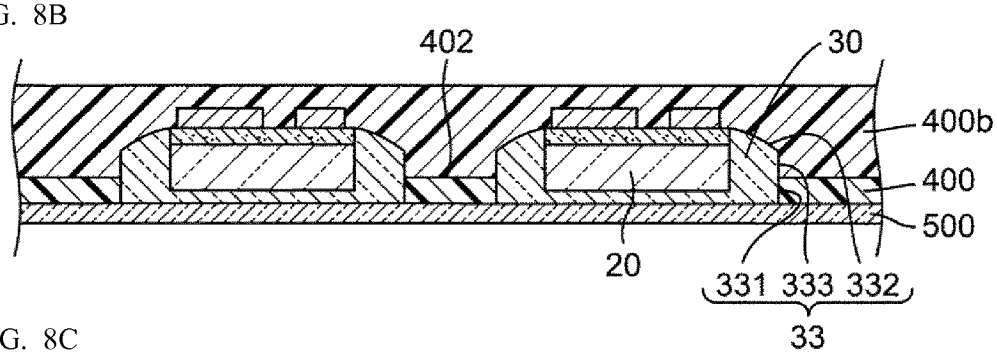
FIG. 8B
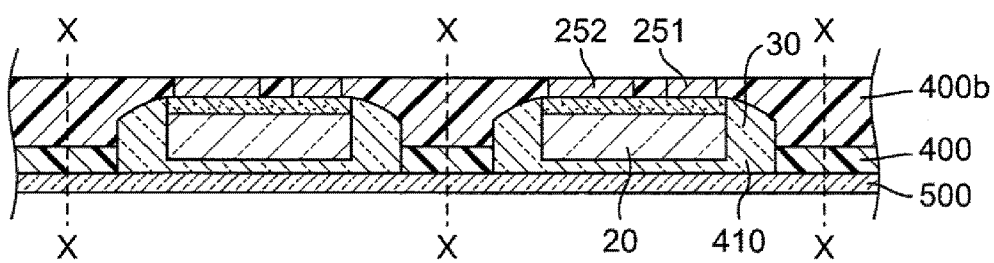
FIG. 8C
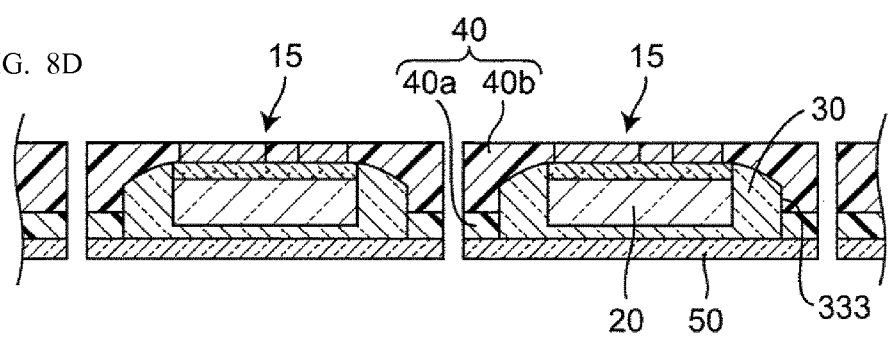
FIG. 8D
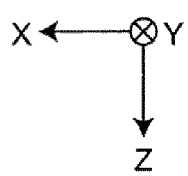

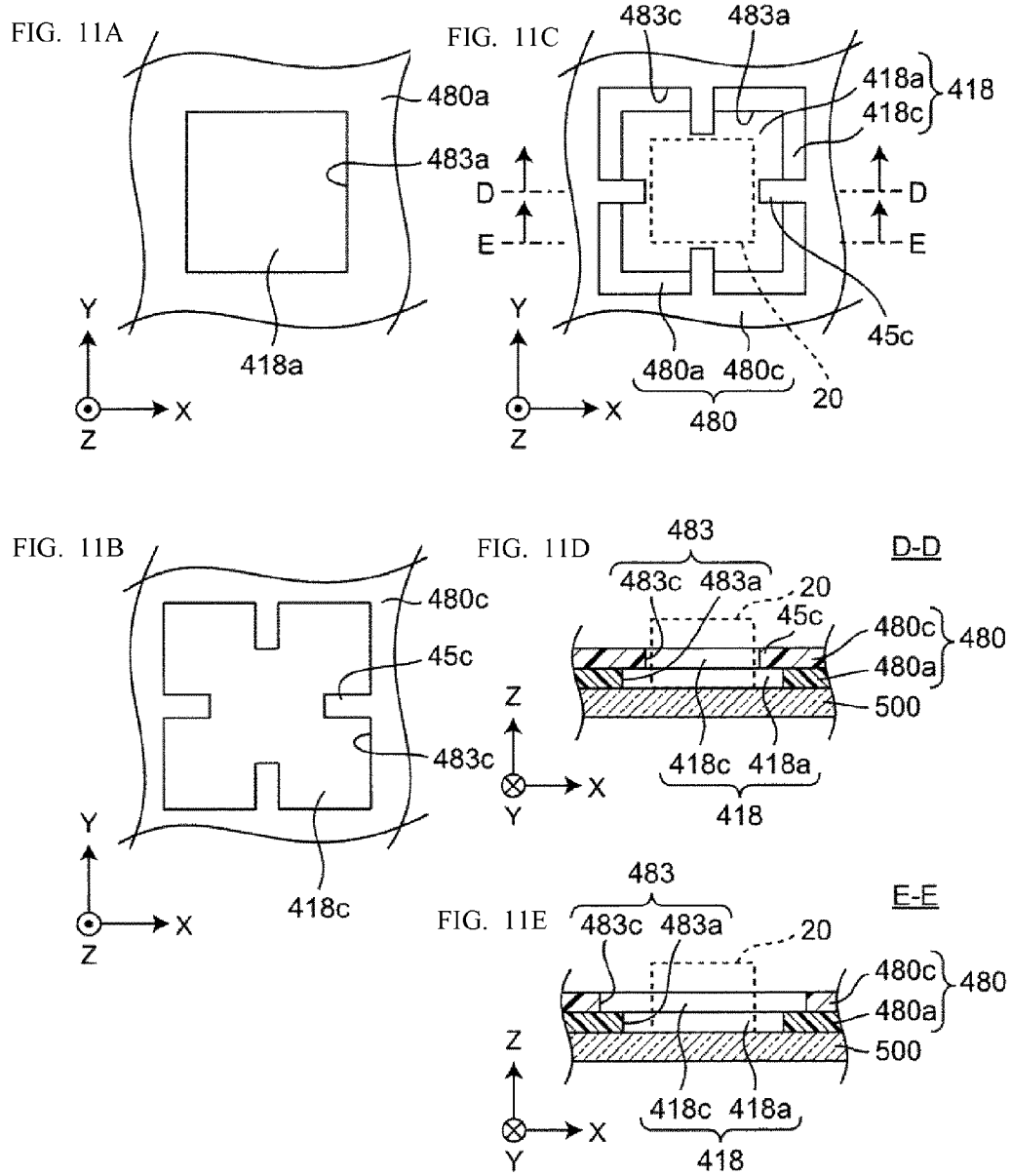

LIGHT EMITTING DEVICE HAVING A REFLECTING MEMBER AND METHOD OF MANUFACTURING THE SAME

CROSS-REFERENCE TO RELATED PATENT APPLICATION

The present application claims priority to Japanese Patent Application No. 2015-192741, filed on Sep. 30, 2015, the disclosure of which is hereby incorporated by reference in its entirety.

BACKGROUND

The present disclosure is related to a method of manufacturing a light emitting device.

There has been known light emitting devices in which lateral surfaces of a light emitting element are covered with a reflecting member instead of providing a housing to house a light emitting element (for example, Japanese Unexamined Patent Publication No. 2012-227470). In those light emitting devices, a fillet is arranged between a light emitting element and a reflecting member so that light emitted from a lateral surface of the light emitting element is reflected by an interface between the light emitting element and the reflecting member, and through the fillet, extracted to a light emitting surface side of the light emitting device, to improve light extraction efficiency of the device.

Japanese Unexamined Patent Publication No. 2012-227470 discloses a method of manufacturing a light emitting device in which an adhesive is applied on a surface of a fluorescent material sheet and a light emitting element is arranged on it. The adhesive wet-spreads on the surface of the fluorescent material sheet and lateral surfaces of the light emitting element and forms a fillet after curing. In order to limit the area of the adhesive to wet-spread on the fluorescent material sheet, a dam member can be disposed on the surface of the fluorescent material sheet before applying the adhesive (paragraphs [0039] to [0043] and FIG. 7 to FIG. 8E in Japanese Unexamined Patent Publication No. 2012-227470). The dam member is formed of a silicone resin or the like which is disposed on the surface of the fluorescent material sheet by using a printing method.

SUMMARY

In the case where the dam member is disposed by using a printing method, the surface shape of the dam member may be deformed after being disposed and while being hardened due to surface tension or the like. Also, before the dam member is cured, the dam member may further wet spread on the surface of the fluorescent material sheet. Such deformation of the dam member may lead to hindering of precise controlling of the shape and/or positioning of the fillet. For this reason, there has been a need for a method of disposing an adhesive with the use of a dam member that is disposed without using any printing method.

A method of manufacturing a light emitting device according to one embodiment of the present invention includes providing a reflecting sheet having a first surface and a second surface and defining through-holes, placing a wavelength-converting sheet on the first surface side of the reflecting sheet to cover openings of the through-holes at the first surface side, disposing a light-transmissive adhesive in the openings of the through-holes, disposing a light emitting element in each of the through-holes so that a light emitting surface of the light emitting element faces the wavelength converting sheet, fixing the light emitting element in the through-hole by the adhesive, and covering the second surface of the reflecting sheet and an outer surface of the adhesive by a reflecting material.

In the present disclosure, an adhesive can be disposed with the use of a dam member that is disposed without using any printing method.

BRIEF DESCRIPTION OF THE DRAWINGS

FIG. 5A to FIG. 5F are schematic plan views showing various shapes of opening of through-holes at a first surface side of a reflecting sheet.

FIG. 8A to FIG. 8D are schematic cross-sectional views illustrating a method of manufacturing a light emitting device according to a modified example of the first embodiment.

FIG. 11A to FIG. 11C are schematic plan view illustrating a method of manufacturing a light emitting device according to a modified example of the second embodiment. FIG. 11D is a schematic plan view taken along line D-D of FIG. 11C. FIG. 11E is a schematic cross-sectional view taken along line E-E of FIG. 11C.

DETAILED DESCRIPTION

Next, embodiments of the present invention will be described in detail with reference to the drawings. In the description below, when appropriate, terms which indicate specific directions or locations (for example, "up", "down", "right", "left" and other terms expressing those) may be applied. But those terms are used for easy understanding of the disclosure with reference to the accompanying drawings, and thus the technical scope of the disclosure shall not be limited by the meaning of those terms. The same numerals in different drawings indicate the same or similar portions or members.

The present disclosure has recognized that in a method of manufacturing a light emitting device, using a printing method to dispose a dam member as in Japanese Unexamined Patent Publication No. 2012-227470, after printing a dam material to form a predetermined shape and before curing the dam material, a surface shape of the dam member may be deformed due to surface tension or the like, and/or the dam material may wet-spread on a fluorescent material sheet, and such deformation of the dam member may lead difficulty in precise controlling of arranging regions of the adhesive. According to certain embodiments of the present invention, in a manufacturing a light emitting device, a reflecting sheet provided with through-holes is used to facilitate precise controlling of arranging regions of an adhesive. Consequently, shape of a light-transmissive member covering lateral surfaces of a light emitting element can be stably formed. In the below, configuration of a light emitting device will be summarized below before describing a method of manufacturing a light emitting device.

First Embodiment

Figure 1:
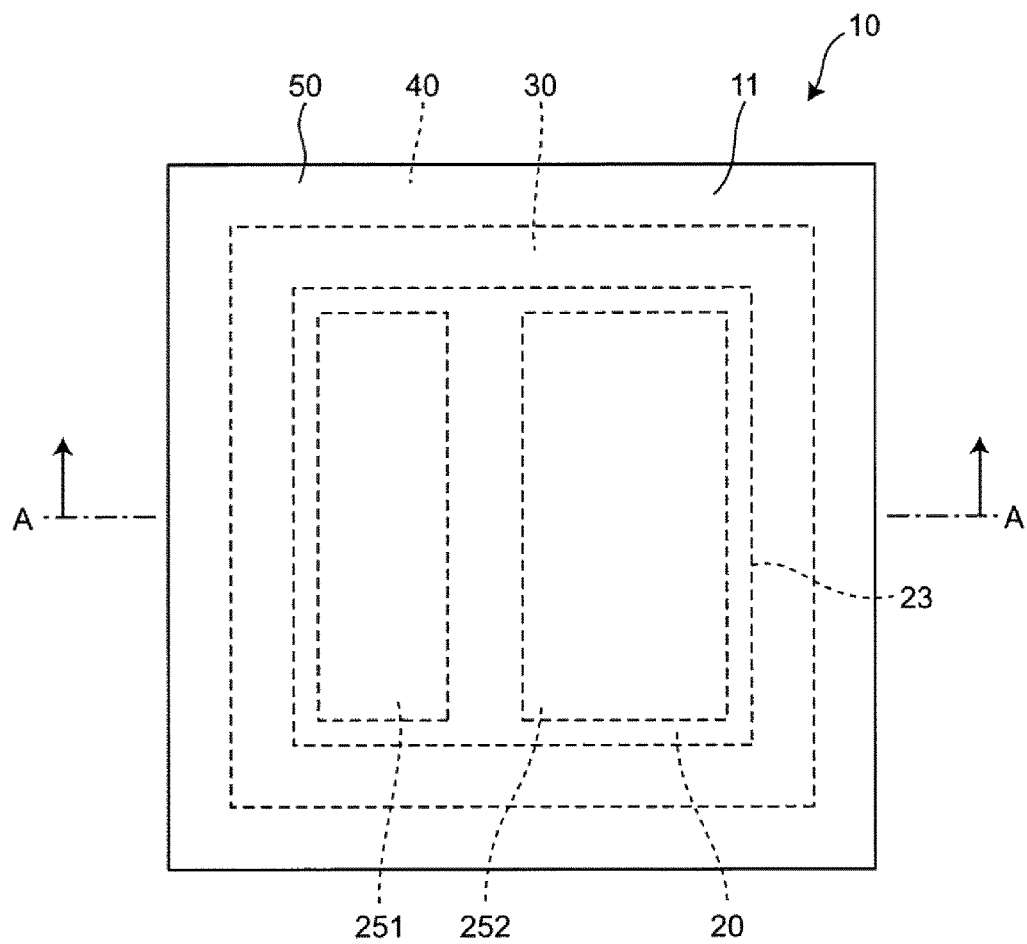
FIG. 1 is a schematic plan view of a light emitting device according to a first embodiment.
Figure 2A:
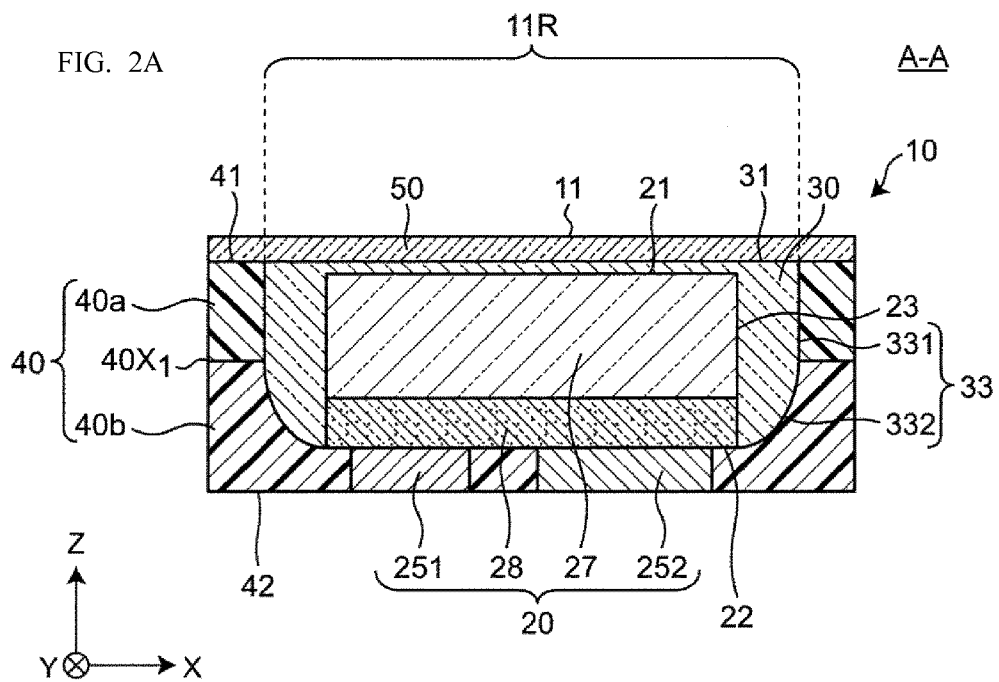
FIG. 2A is a schematic cross-sectional view of the light emitting device taken along line A-A in FIG. 1.

FIG. 1 is a schematic plan view of a light emitting device according to a first embodiment. FIG. 2A is a schematic cross sectional view taken along line A-A of FIG. 1. The light emitting device 10 according to the first embodiment as shown in FIG. 1 and FIG. 2A includes a light emitting element 20, a light-transmissive member 30 disposed on lateral surfaces of the light emitting element 20, a reflecting member 40 covering outer surfaces 33 of the light-transmissive member 30, and a wavelength converting member 50 disposed on a light emitting surface side 11 of the light emitting device 10.

Figure 2B:
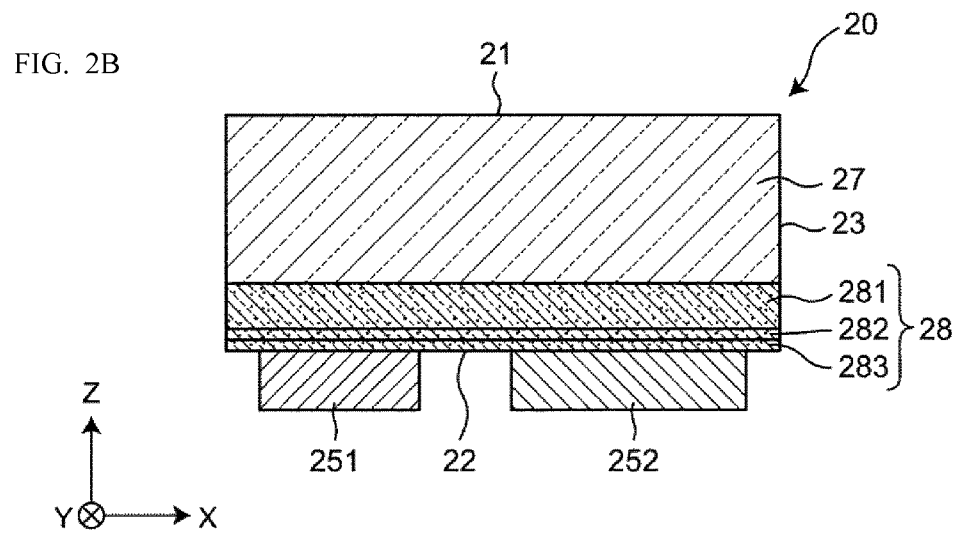
FIG. 2B is a schematic cross-sectional view of a light emitting element included in the light emitting device shown in FIG. 2B.

FIG. 2B is a schematic cross-sectional view of the light emitting element included in the light emitting device shown in FIG. 2A. As shown in FIG. 2B, the light emitting element 20 may be a semiconductor light emitting element that includes a light-transmissive substrate 27 and a semiconductor layered body 28 formed on a lower surface side of the light-transmissive substrate 27. The light emitting element 20 has a light emitting surface 21 (a surface of the light-transmissive substrate 27 side), a back surface 22 at the opposite side of the light emitting surface 21 (a surface at the semiconductor layered body 28 side), and lateral surfaces 23 connecting to both the light emitting surface 21 and the back surface 22. In FIGS. 2A and 2B, light emitted from the semiconductor layered body 28 of the light emitting element 20 propagates through the light-transmissive substrate 27, or propagate through the lateral surfaces 23 of the light emitting element 20 and the light-transmissive member 30 and is extracted to the light emitting surface 11 side of the light emitting device 10.

As shown in FIG. 2B, a first electrode 251 and a second electrode 252 are disposed on the back surface 22 (i.e., a lower surface of the semiconductor layered body 28) of the light emitting element 20 in order to supply electric current to the light emitting element 20. In the present specification, the term "back surface 22" of the light emitting element 20 indicates a lower surface of the light emitting element 20 except for the electrodes 251 and 252.

Referring again FIG. 2A, the light-transmissive member 30 covers at least a portion of the lateral surfaces 23 of the light emitting element 20 to direct light emitted from the lateral surfaces 23 toward the light emitting surface 11 of the light emitting device 10. That is, light that reaches the lateral surfaces 23 of the light emitting element 20 can be extracted to outside of the light emitting element 20 through the light-transmissive member 30 without reflecting the light by the lateral surfaces 23. With the light-transmissive member 30, light reflected by the lateral surfaces 23 of the light emitting element 20 and returns into the light emitting element 20 (i.e., returning light) can be reduced. Such returning light attenuates in the light emitting element 20. Thus, a decrease in the returning light decreases loss of light, and thus the light extraction efficiency of the light emitting device 10 can be improved.

In the example shown in FIG. 2A, the light-transmissive member 30 is arranged as a thin layer between the light emitting surface 21 of the light emitting element 20 and a wavelength converting member 50. In other words, the light emitting surface 21 of the light emitting element 20 is covered by the light-transmissive member 30. Light reaching the light emitting surface 21 of the light emitting element 20 passes through the thin layer of the light-transmissive member 30 and reaches the wavelength converting member 50. The light-transmissive member 30 may not be provided between the light emitting surface 21 of the light emitting element 20 and the wavelength converting member 50. That is, the light emitting surface 21 of the light emitting element 20 and the wavelength converting member 50 may be directly in contact with each other.

The light-transmissive member 30 has a first surface 31 located at the light emitting surface 21 side of the light emitting element 20. In the present specification, the term "the light emitting surface 21 side of the light emitting element 20" refers to a direction side to which the light emitting surface 21 is facing when viewed from a center part of the light emitting element 20, and that is the upper side in FIGS. 2A and 2B. Further, the light-transmissive member 30 has outer surfaces 33 covered by the reflecting member 40. The outer surfaces 33 include first outer surfaces 331 covered by a first reflecting member 40a and second outer surfaces 332 covered by a second reflecting member 40b. In the example shown in FIG. 2A, the first outer surfaces 331 are flat surfaces and the second outer surfaces 332 are outwardly (i.e., toward the reflecting member 40) projecting curved surfaces.

The reflecting member 40 covers the outer surfaces 33 of the light-transmissive member 30. If the lateral surface 23 and a back surface 22 of the light emitting element 20 are exposed from the light-transmissive member 30, the reflecting member 40 also covers those exposed surfaces. The light emitting surface 21 of the light emitting element 20 is not covered by the reflecting member 40. The reflecting member 40 has a first surface 41 located at the light emitting surface 21 side of the light emitting element 20 and a second surface 42 located at opposite side of the first surface 41. The reflecting member 40 includes a first reflecting member 40a at the first surface 41 side and a second reflecting member 40b at the second surface 42 side. The first reflecting member 40a and the second reflecting member 40b may be made of a same reflecting material or may be made of different reflecting material. The first reflecting member 40a and the second reflecting member 40b are in contact with each other. The interface $40x_1$ between the first reflecting member 40a and the second reflecting member 40b is preferably a flat surface. The first reflecting member 40a specifies an actual light region (light-emitting region 11R) in the light-emitting surface 11 of the light emitting device 10. Light propagating in the light-transmissive member 30 is reflected at the inner lateral surfaces of the first reflecting member 40a, so that the light emitting region 11R of the light emitting device 10 is substantially correspond to the range surrounded by the inner lateral surfaces of the first reflecting member 40a.

The wavelength converting member 50 is configured to convert a portion of light transmitting the wavelength converting member 50 into light of a different wavelength. The wavelength converting member 50 contains a fluorescent material that can be excited by light transmitting through the fluorescent material. The light emitting device 10 has a wavelength converting member 50, which allows for obtaining of the light emitting device 10 that can emit light of an emission color that differs from the emission color of the light emitting element 20. For example, a light emitting element 20 adapted to emit blue light and a wavelength converting member 50 adapted to absorb the blue light and emit yellow fluorescent light are combined to obtain a light emitting device 10 to emit white light.

The wavelength converting member 50 is disposed covering the first surface 31 of the light-transmissive member 30 and the first surface 41 of the reflecting member 40. Light generated in the light emitting element 20 is emitted from the light emitting surface 21 or the lateral surfaces 23 of the light emitting element 20, propagates through the light-transmissive member 30 and is extracted from the first surface 31 of the light-transmissive member 30. Therefore, disposing the wavelength converting member 50 to cover the first surface 31 of the light-transmissive member 30 allows substantially all the light generated in the light emitting element 20 to pass the wavelength converting member 50. That is, light that does not pass the wavelength converting member 50 substantially does not present, so that color unevenness in the emission of the light emitting device 10 can be reduced.

A method of manufacturing a light emitting device will be described below with reference to FIG. 3A to FIG. 6B.

Providing Reflecting Sheet 400

Figure 3A:
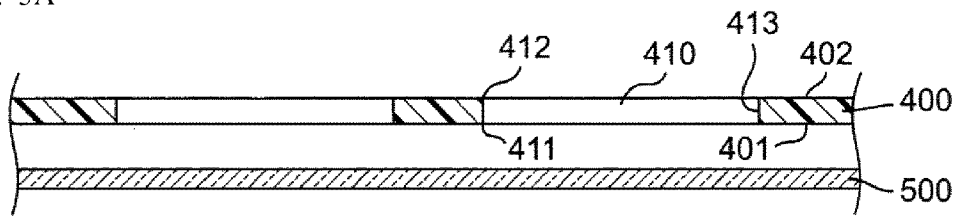
FIG. 3A to FIG. 3D are schematic cross-sectional views illustrating a method of manufacturing a light emitting device according to the first embodiment.

A reflecting sheet 400 defining through-holes 410 is provided (FIG. 3A). The through-holes 410 penetrate from a first surface 401 to a second surface 402 of the reflecting sheet 400. A single or a plurality of through-holes 410 may be defined in the reflecting sheet 400. The through-holes 410 shown in FIG. 3A are defined with the openings 411 of a same shape at the first surface 401 side and the openings 412 at the second surface side 402, for example, a substantially square shape as shown in FIG. 5A. In the present disclosure, the reflecting sheet 400 formed with through-holes 410 is employed. Thus, the shape of the through-holes 410 can be precisely defined and deformation of the through-holes 410 after formation of the through-holes 410 can be prevented. Accordingly, the method of manufacturing according to the present disclosure can eliminate deformation of the dam member due to surface tension that may occur between printing and curing in the case of forming the dam member by using a printing method as illustrated in Japanese unexamined patent publication No. 2012-227470. Even if the deformation of the dam member is slight in the case of using such a printing method, a slight deformation will not occur in the method according to the present disclosure. Also, in a printing method as illustrated in Japanese unexamined patent publication No. 2012-227470, an increase in the thickness of the dam material may be difficult to obtain or may require more time and work such as repeating printing multiple times. In the present disclosure, a sheet material for the reflecting sheet 400 can be provided with an appropriate thickness, so that an increase in the thickness of the reflecting sheet 400 can be easily obtained.

The through-holes 410 can be formed by punching, cutting, drilling, or the like, of the reflecting sheet 400. Punching, which allows relatively easy and precise formation of various shapes, is preferable.

When completed, the reflecting sheet 400 and the inner lateral surfaces 413 defining the through-holes 410 respectively serve as the first reflecting member 40a and the inner lateral surfaces of the first reflecting member 40a of the light emitting device 10 (FIG. 3A, FIG. 2A). As described above, in the light emitting device 10, the light-emitting region 11R of the light emitting surface 11 of the light emitting device 10 is specified by the inner lateral surfaces (that is, the inner lateral surfaces 413 defining the through-hole 410) of the first reflecting member 40a. More precisely, the light-emitting region 11R of the light emitting surface of the light emitting device 10 is specified by the shape of the inner lateral surfaces of the first reflecting member 40a at the light emitting surface 11 side of the light emitting device 10 (that is the shape of the opening 411 of the through-hole 410 at the first surface 401 side of the reflecting sheet 400). Thus, in order to specify a desired light-emitting region 11R of the light emitting device 10, the shape of the opening 411 at the first surface 401 side of the through-hole 410 of the reflecting sheet 400 can be appropriately changed. Examples of the shapes of the openings of the through-holes defined in the reflecting sheet 400 are shown in FIG. 5A to FIG. 5F.

As described above, the through-hole 410 shown in FIG. 5A, the opening 411 at the first surface side and the opening 412 at the second surface 402 side are substantially square and are substantially the same size. In the case of the through-hole 410, the opening 411 at the first surface 401 side is substantially square, so that the light-emitting region 11R of the light emitting device 10 has a substantially square shape. In FIG. 5A, the light emitting element 20 has a square shape in a top view, so that the opening 411 at the first surface side of the through-hole 410 formed in the reflecting sheet 400 is specified as a substantially square shape.

The through-hole 410b shown in FIG. 5B, the opening 411b at the first surface side and the opening 412b at the second surface 402 side are substantially square with rounded corners and are substantially the same size. In the case of the through-hole 410b, the opening 411b at the first surface 401 side is substantially square with rounded corners, so that the light-emitting region 11R of the light emitting device 10 has a substantially square shape with rounded corners. The through-hole 410c shown in FIG. 5C, the opening 411c at the first surface side and the opening 412c at the second surface 402 side are substantially circular and are substantially the same size. In the case of the through-hole 410c, the opening 411c at the first surface 401 side is substantially circular, so that the light-emitting region 11R of the light emitting device 10 has a substantially circular shape.

In the through-hole 410d shown in FIG. 5D, the opening 411d at the first surface side and the opening 412d at the second surface 402 side are substantially regular hexagon and are substantially the same size. In the case of the through-hole 410d, the opening 411d at the first surface 401 side is hexagonal, so that the light-emitting region 11R of the light emitting device 10 has a hexagonal shape. In FIG. 5D, the light emitting element 207 has a hexagonal shape in a top view, so that the opening 411 at the first surface side of the through-hole 410d formed in the reflecting sheet 400 is specified as a hexagonal shape. As described above, the opening of the through-hole can be selected to correspond to the shape of the light emitting element 207.

Figure 3B:
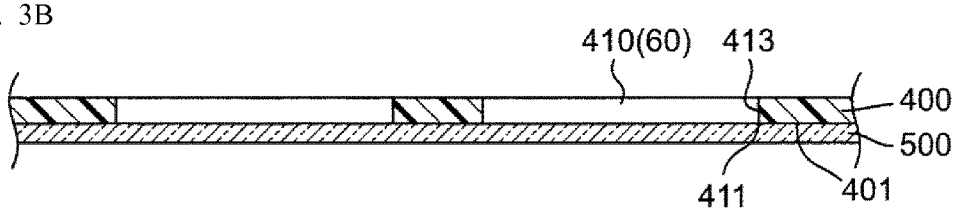
Figure 3C:
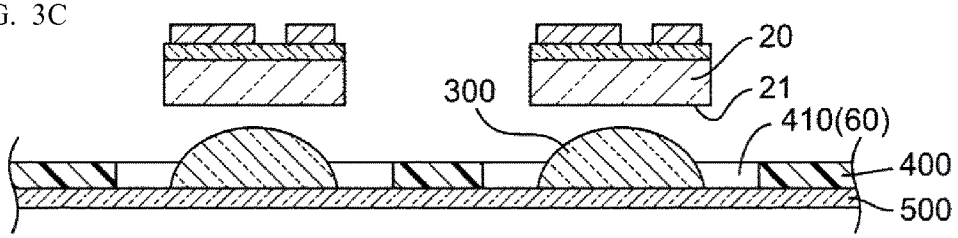
Figure 3D:
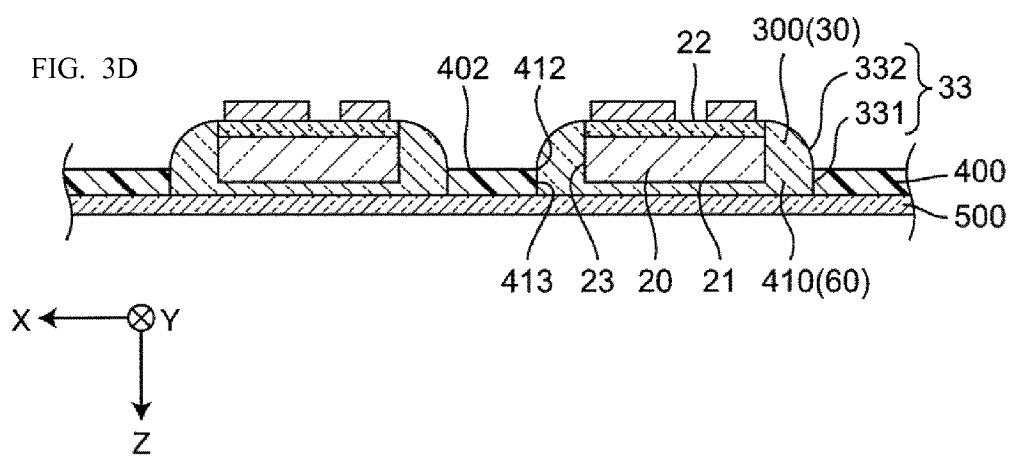

As described below, the light emitting elements 20 are respectively arranged in the through-holes 410 of the reflecting sheet 400 (FIG. 3C and FIG. 3D). In order to facilitate the arrangement of the light emitting elements 20 at desired positions in the through-holes 410, a guide can be provided for the through-holes 410. In the through-hole 410e shown in FIG. 5E, a projection 45e is formed on each of four inner lateral surfaces 413e defining the through-hole that is substantially square in a top view. Each projection 45e projects inward from each of the inner lateral surfaces 413e defining the through-hole 410e. A gap is provided between two projections 45e that are formed respectively on two inner lateral surfaces 413e facing one another. In order to house the light emitting element 20, the gap between the two projections 45e is defined slightly larger than the dimension of one side of the light emitting element 20. The projections 45e serve as a guide for positioning the light emitting element 20 in each of the through-holes 410e of the reflecting sheet 400.

In the through-hole 410f shown in FIG. 5F, a projection 45f is formed at each of four corners 414B of the through-hole 410f that is substantially square in a top view. Each projection 45f projects inward from each corner 414B of the through-hole 410e. A gap is provided between two projections 45f that are formed respectively on two corners 414B diagonally facing each other in the through-hole 410f In order to house the light emitting element 20, the gap between the two projections 45f is defined slightly larger than a diagonal dimension of the light emitting element 20. The projections 45f serve as a guide for positioning the light emitting element 20 in each of the through-holes 410e of the reflecting sheet 400.

Figure 6A:
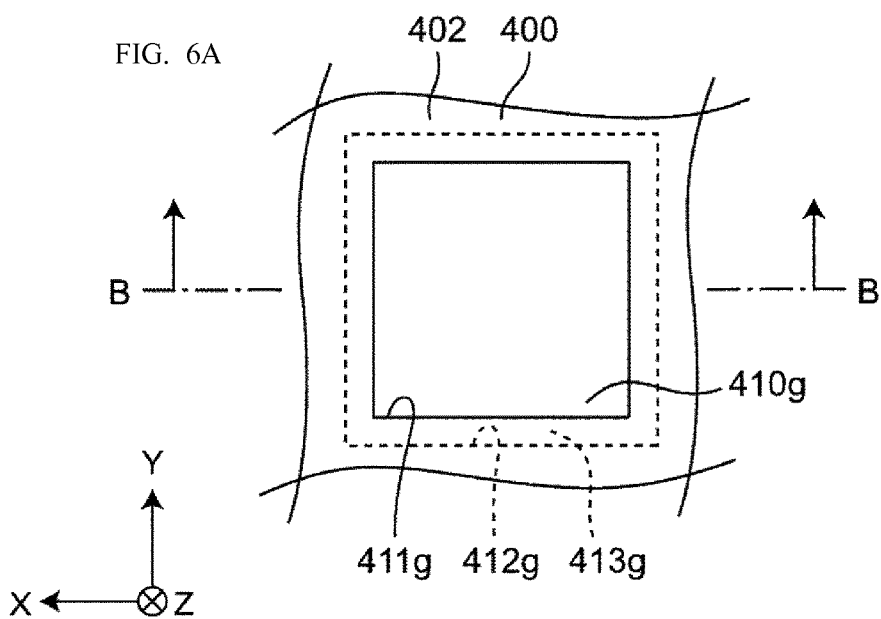
FIG. 6A is a schematic plan view showing a shape of the opening of a single through-hole at a first surface side of a reflecting sheet.
Figure 6B:
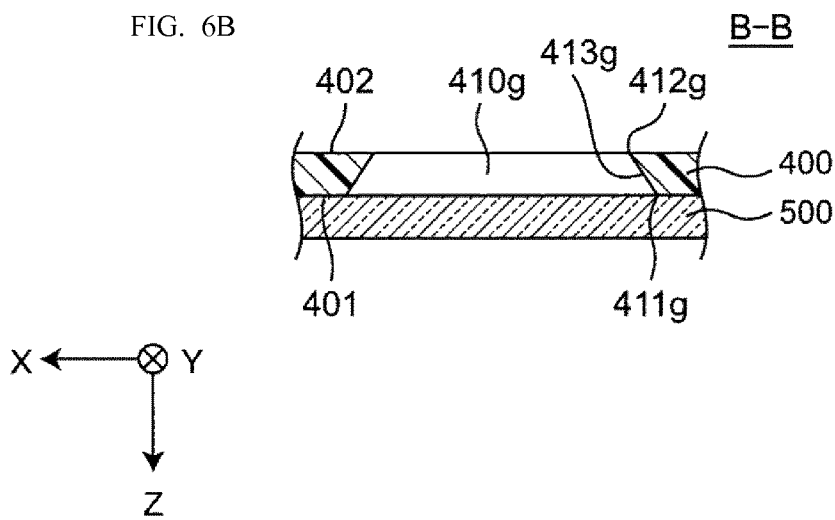
FIG. 6B is a schematic cross-sectional view taken along line B-B of FIG. 6A.

In the through-hole 410 shown in FIG. 3A, the inner lateral surfaces 413 are perpendicular to the first surface 401 of the reflecting sheet 400. Alternatively, as shown in FIG. 6B, the inner lateral surfaces 413g defining the through-hole 410g may be inclined relative to the first surface 401 of the reflecting sheet 400. In the through-hole 410g shown in FIG. 6A and FIG. 6B, the opening 411g at the first surface 401 side and the opening 412g at the second surface 402 side of the reflecting sheet 400 are both square. The opening 411g at the first surface 401 side is larger than the opening 412g at the second surface 402 side. The inner lateral surfaces 413g defining the through-hole 410g are widening toward the first surface 401 from the second surface 402 of the reflecting sheet 400.

Layering Reflecting Sheet 400 and Wavelength-Converting Sheet 500

A wavelength-converting sheet 500 is provided (FIG. 3A) and the wavelength-converting sheet 500 is layered on the first surface 401 side of the reflecting sheet 400 (FIG. 3B). With this arrangement, the openings 411 of the through-holes 410 at the first surface 401 side are covered by the wavelength-converting sheet 500. Thus, recesses 60 defined by the inner lateral surfaces 413 defining the through-holes 410 and the surface of the wavelength-converting sheet 500 are formed. The reflecting sheet 400 and the wavelength-converting sheet 500 may be fixed by an adhesive, for example. If either the reflecting sheet 400 or the wavelength-converting sheet 500 or both has tackiness (adhesiveness), the reflecting sheet 400 and the wavelength-converting sheet 500 can be temporarily fixed by layering without using an adhesive.

Disposing Adhesive 300

A light-transmissive adhesive 300 is disposed in each through-hole 410 (in a recess 60) of the reflecting sheet 400 (FIG. 3E). The amount of the adhesive 300 is adjusted so as not to overflow the through-holes 410 (recesses 60).

Disposing Light Emitting Element 20

The same number of light emitting elements 20 as the through-holes 410 of the reflecting sheet 400 are provided (FIG. 3C), and one light emitting element 20 is disposed in each of the through-holes 410 (recesses 60) (FIG. 3D). At this time, the light emitting elements 20 are disposed so that the light emitting surface 21 of each of the light emitting elements 20 faces the wavelength-converting sheet 500. The adhesive 300 disposed beforehand in each of the through-holes 410 (in the recesses 60) is pushed by the light emitting surface 21 of the light emitting element 20 and expanded in the through-hole 410 (in the recess 60) and rose up along the lateral surfaces of the light emitting element 20. If the amount of the adhesive 300 exceeds the volume of gap between the inner surfaces defining the recess 60 and the outer surfaces of the light emitting element 20 (that is, a total volume of the gap between the inner lateral side surfaces 413 defining the through-hole 410 and the lateral surfaces of the light emitting element 20 and the gap between the surface of the reflecting sheet 400 and the light emitting surface 21 of the light emitting element 20), the adhesive 300 overflows from the gap between the lateral surfaces of the light emitting element 20 and the inner lateral surfaces 413 defining the through-hole 410. If the amount of the adhesive 300 is adequate, the adhesive 300 can be pinned at an edge of the back surface 22 of the light emitting element 20 and at an edge of the opening 412 of the through-hole 410 at the second surface 402 side of the reflecting sheet 400. That is, the adhesive 300 is adequate, due to surface tension, the adhesive 300 maintains its bulged state between the edge of the back surface 22 of the light emitting element 20 and the edge of the of the through-hole 410 at the second surface 402 side of the reflecting sheet 400.

The second surface 402 of the reflecting sheet 400 is preferably flat. In the case where the second surface 402 is not flat (for example, a surface with irregular texture), wetness of the adhesive 300 to the second surface 400 increases, which may decrease the pinning effect on the adhesive 300 at the edge of the opening 412 of the through-hole 410 at the second surface 402 side of the reflecting sheet 400. Thus, the adhesive 300 is easily spread onto the second surface 402. As a result, the deposition of the adhesive 300 at preferable positions may become difficult. For this reason, the second surface 402 is preferably a flat surface and particularly preferably a smooth flat surface (that is, a surface without irregular texture). In the case where the second surface 402 of the reflecting sheet 400 is a flat surface, covering the second surface 402 of the reflecting sheet 400 by the surface-reflecting material 400b in the step of covering by a reflecting material 400b forms a flat interface (corresponding an interface $40x_1$ between the first reflecting member 40a and the second reflecting member 40b.

As shown in FIG. 3D, the back surface 22 of the light emitting element 20 can be located above (i.e., outside of the through-hole 410) the second surface 402 of the through-hole 410 of the reflecting sheet 400. With this arrangement, the bulged outer surface of the adhesive 300 is in an outward convex shape at an outside of the opening 412 of the second surface 402 side of the through-hole 410. In order to arrange the back surface 22 of the light emitting element 20 above the second surface 402 of the reflecting sheet 400, for example, the light emitting element 20 has a thickness (a dimension of the light emitting element 20 from the light emitting surface 21 to the back surface 22) greater than the thickness of the reflecting sheet 400. If the light emitting element 20 has a thickness equivalent to or smaller than the thickness of the reflecting sheet 400, an increase in the thickness of the adhesive 300 between the light emitting surface 21 of the light emitting element 20 and the surface of the wavelength-converting sheet 500 can allow the back surface 22 of the light emitting element 20 locating above the second surface 402 of the reflecting sheet 400.

The step of disposing light emitting element may be performed before the step of disposing adhesive. That is, it may be such that the light emitting element 20 is disposed in the through-hole 410 before disposing the adhesive 300 in the through-hole 410, then, the adhesive 300 is disposed to fill the gap between the lateral surfaces 23 of the light emitting element 20 and the inner lateral surfaces 413 of the through-hole 410.

Fixing Light Emitting Element 20

The light emitting element 20 is fixed in the through-hole 410 by hardening the adhesive 300 (FIG. 3D). The hardened adhesive 300 becomes the light-transmissive member 30 of the light emitting device 10. The adhesive 300 is hardened while the back surface 22 of the light emitting element 20 is maintained outside of the through-hole 410 (recess 60). Thus, the light emitting element 20 is fixed in the through-hole 410 in this state. The adhesive 300 is hardened in the upward convex state. The light-transmissive member 30 obtained by hardening the adhesive 300 has an outer surface (first outer surface 331) that is in contact with the reflecting sheet 400 and an outer surface (second outer surface 332) that is exposed.

Covering by Reflecting Material 400b

Figure 4A:
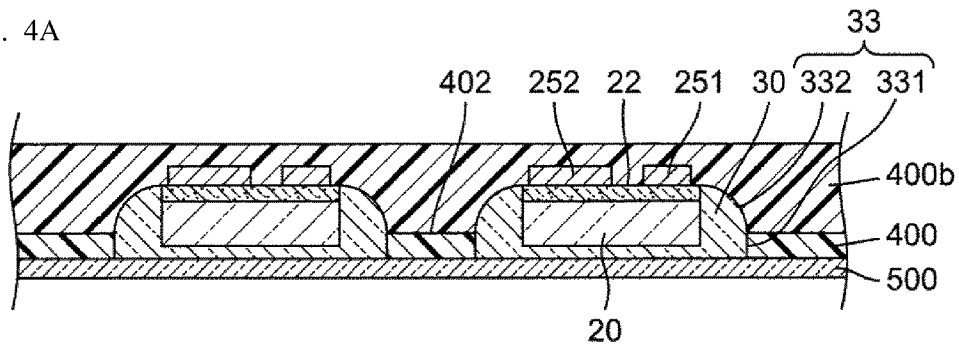
FIG. 4A to FIG. 4C are schematic cross-sectional views illustrating a method of manufacturing a light emitting device according to the first embodiment.

The second surface 402 of the reflecting sheet 400 and the outer surface (second outer surface 332) of the light-transmissive member 30 (i.e., hardened adhesive) are covered by the reflecting sheet 400 (FIG. 4A). Of the outer surfaces 33 of the light-transmissive member 30, the first outer surface 331 is covered by the reflecting sheet 400 and the second outer surface 332 is covered by the reflecting material 400b. When completed, the reflecting sheet 400 and the reflecting material 400b become the first reflecting member 40a and the second reflecting member 40b of the light emitting device 10. The second surface 402 of the reflecting sheet 400 is a relatively flat surface, so that the interface between the reflecting sheet 400 and the reflecting material 400b becomes a relatively flat surface. Further, covering the back surface 22 of the light emitting element 20 by the reflecting material 400b allows for reducing leakage of light from the back surface 22 of the light emitting element 20. Further, the first electrode 251 and the second electrode 252 may be covered by the reflecting material 400b, which is followed by exposing the first electrode 251 and the second electrode 252.

Exposing First Electrode 251 and Second Electrode 252

Figure 4B:
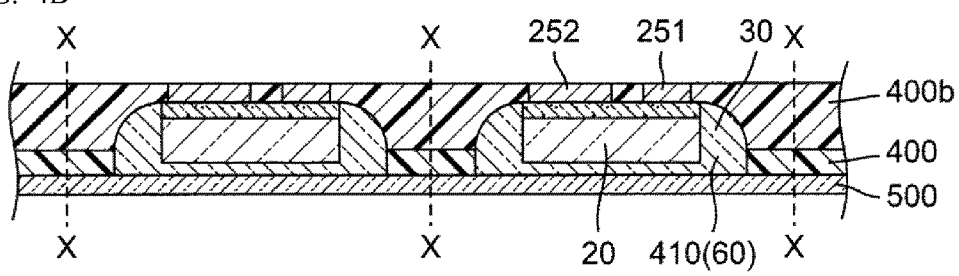
Figure 4C:
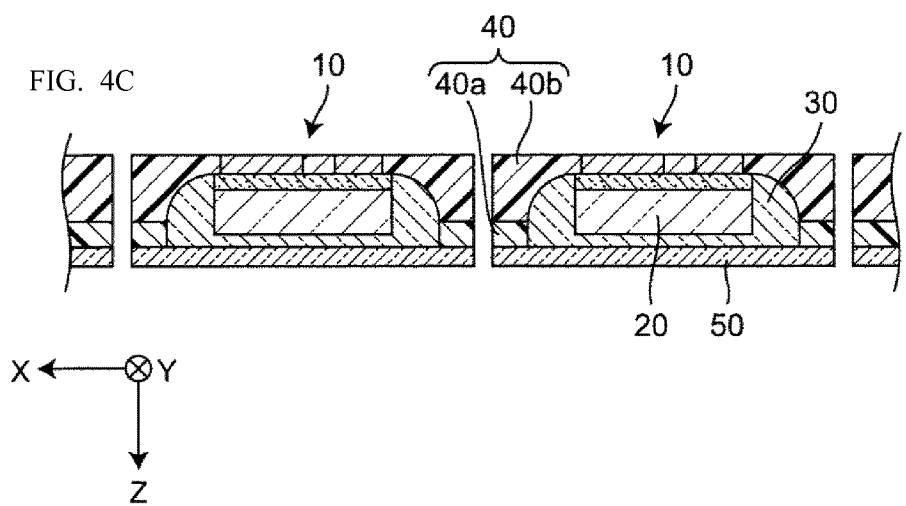

In the step of covering by reflecting material 400b, in the case of covering the first electrode 251 and the second electrode 252 by the reflecting material 400b, the first electrode 251 and the second electrode 252 are exposed by reducing the thickness of the reflecting material 400b (FIG. 4B). To reduce the thickness of the reflecting material 400b, cutting, polishing, or the like can be used.

Singulating Light Emitting Device

In the case that a plurality of through-holes 410 are formed, the reflecting material 400b, the reflecting sheet 400, and the wavelength-converting sheet 500 are cut at locations (along lines X-X in FIG. 4B) between two adjacent through-holes 410 to singulate individual light emitting devices 10. As described above, a plurality of light emitting devices 10 can be manufactured simultaneously. After singulating, the reflecting material 400b, the reflecting sheet 400, and the wavelength-converting sheet 500 become the first reflecting member 40a, the second reflecting member 40b, and the wavelength converting member 50, respectively. Also, cutting along the lines X-X allows the first reflecting member 40a, the second reflecting member 40b, and the wavelength converting member 50 on a same plane at each of respective outer lateral surfaces of the light emitting device 10.

Variation

In the step of disposing the light emitting elements, to increase a pinning effect (FIG. 3D) on the adhesive 300 at the edge of the openings 412 of the through-holes 410 of the reflecting sheet 400, a releasing film can be provided on a surface of the reflecting sheet 400. Such a releasing film may be made of a film-shaped base material coated with a releasing agent such as polytetrafluoroethylene (Teflon®) and can decrease wettability to an adhesive. Manufacturing a light emitting device with the use of a releasing film will be described below. Description of the steps similar to those in the first embodiment may be appropriately omitted.

Covering Reflecting Sheet 400 by Releasing Film 700

Figure 7A:
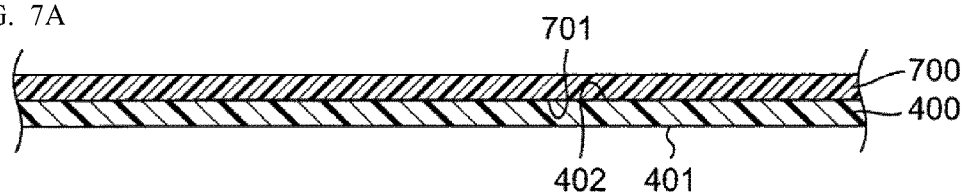
FIG. 7A to FIG. 7E are schematic cross-sectional views illustrating a method of manufacturing a light emitting device according to a modified example of the first embodiment.

Of the two surfaces (a first surface 401 and a second surface 402) of the reflecting sheet 400, the second surface 402 is covered by the first surface 701 of the releasing film 700 (FIG. 7A). The releasing film 700 will be removed from the reflecting sheet 400 in a later step, so that the releasing film 700 is preferably fixed to the reflecting sheet 400 in an easily separative manner. For example, a weakly adhesive material may be applied on one surface of the releasing film 700 to adhere to the reflecting sheet 400. For the releasing film 700, a commercially available releasing film with adhesive layer may be used.

Providing Reflecting Sheet 400 and Punching Releasing Sheet 700

Figure 7B:
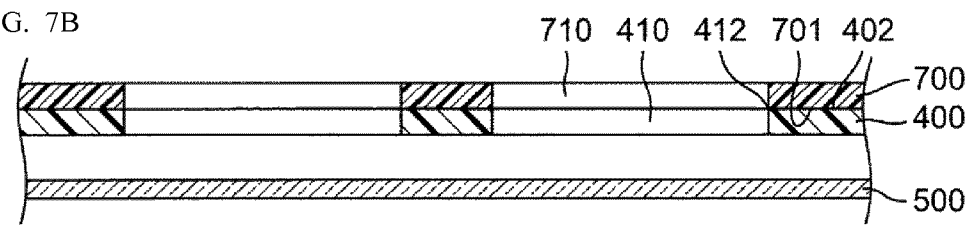

Through-holes are formed in the layered body of the reflecting sheet 400 and the releasing film 700, by punching or the like (FIG. 7B). Thus, formation of the through-holes 410 in the reflecting sheet 400 and formation of the holes 710 in the releasing film 700 at locations corresponding to the through-holes 410 in the reflecting sheet 400 can be performed at once.

The through-holes 410 in the reflecting sheet 400 and the holes 710 in the releasing film 700 may not be formed at the same time. For example, a reflecting sheet with through-holes may be covered by a releasing film that does not have a hole, then, the holes are formed corresponding to the through-holes of the reflecting sheet. In another example, a reflecting sheet with through-holes and a releasing film with holes are provided, and the reflecting sheet is covered by the releasing film while adjusting the through-holes and the holes. By any method, the opening of the holes 71 in the releasing film 700 (more precisely, openings of the holes 710 at the first surface 701 side of the releasing film 700) and the opening of the through-holes 410 at the second surface 402 side of the reflecting sheet 400 are of a same diameter. The releasing film 700 is configured to impede wet spread of the adhesive on the reflecting sheet 400 to improve the pinning effect to the adhesive. Accordingly, the releasing film 700 is needed to cover the reflecting sheet 400 at least before performing the step of disposing the adhesive 300.

Layering Reflecting Sheet 400 and Wavelength-Converting Sheet 500

Figure 7C:
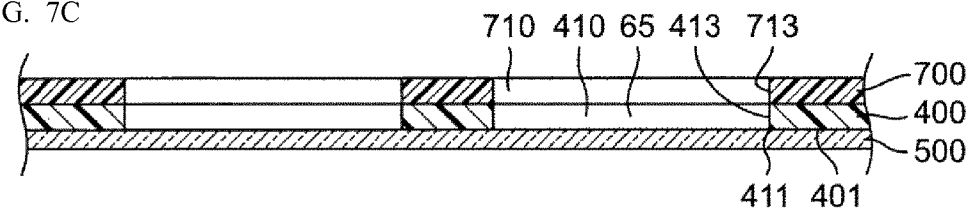

A wavelength-converting sheet 500 is provided (FIG. 7B) and the wavelength-converting sheet 500 is layered on the first surface 401 side of the reflecting sheet 400 (FIG. 7C).

With this arrangement, the openings 411 of the through-holes 410 at the first surface 401 side of the reflecting sheet 400 are covered by the wavelength-converting sheet 500. Thus, the recesses 65 are defined by the wavelength-converting sheet 500, the inner lateral surfaces 413 of the reflecting sheet 400 defining the through-holes 410, and the inner lateral surfaces 713 of the releasing film 700 defining the holes 710.

Disposing Adhesive 300

Figure 7D:
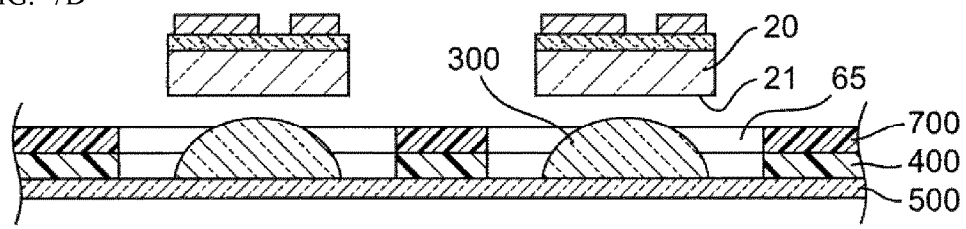

A light-transmissive adhesive 300 is disposed in each of the recesses 65 (FIG. 7D). The amount of the adhesive 300 is adjusted so as not to overflow the recesses 65.

Disposing Light Emitting Element 20

Figure 7E:
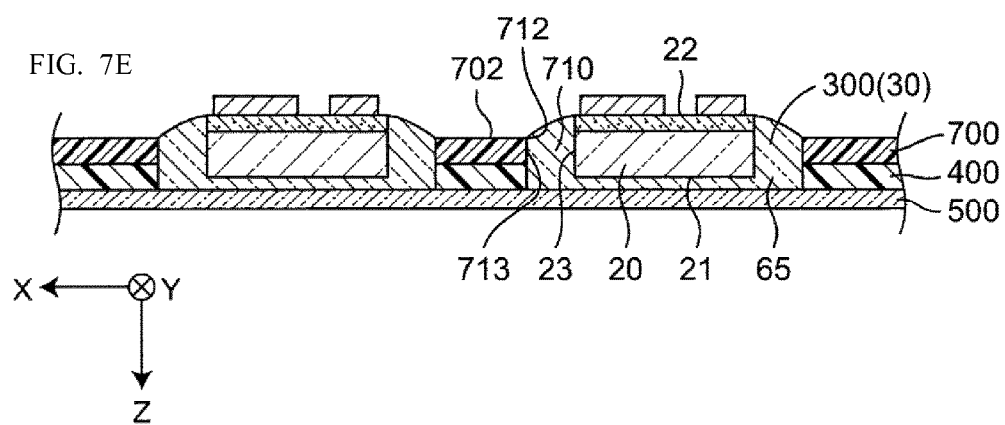

The light emitting elements 20 of the same number as the recesses 65 are provided (FIG. 7D) and disposed in the recesses 65 respectively (FIG. 7E). At this time, the light emitting elements 20 are disposed so that the light emitting surface 21 of each of the light emitting elements 20 faces the wavelength-converting sheet 500. The adhesive 300 disposed beforehand in each of the recesses 65 is pushed by the light emitting surface 21 of the light emitting element 20 and expanded in the recess 65 and rose up along the lateral surfaces of the light emitting element 20. If the amount of the adhesive 300 exceeds the volume of the gap between the lateral surfaces of the light emitting element 20 and the lateral surfaces defining the recess 65 (more specifically, the inner lateral surfaces 713 defining the holes in the releasing film 700), the adhesive will overflow from the gap. If the amount of the adhesive 300 is adequate, the adhesive 300 can be pinned at an edge of the back surface 22 of the light emitting element 20 and at an edge of the opening 712 of the hole 710 at the second surface 702 side of the releasing film 700. That is, due to surface tension, the adhesive 300 maintains its bulged state between the edge of the back surface 22 of the light emitting element 20 and the edge of the opening 712 of the hole 710 at the second surface 702 side of the reflecting sheet 700.

The releasing film 700 has a low wattability to the adhesive 300. Thus, in the present variation, the bulging adhesive 300 can be prevented from wet spreading onto the second surface 702 of the releasing film 700 over the edges of the openings 712 of the holes 710 of the releasing film 700. That is, pinning effect to the adhesive 300 at the edges of the openings 712 of the holes 710 can be improved.

Fixing Light Emitting Element 20

The light emitting elements 20 are fixed in the recesses 65 respectively by hardening the adhesive 300 (FIG. 7E). The hardened adhesive 300 becomes the light-transmissive member 30 of the light emitting device 10.

Removing Releasing Film 700

After the step of fixing the light emitting elements 20, the releasing film 700 is detached from the reflecting sheet 400 and removed (FIG. 8A). The adhesive has been hardened and become a light-transmissive member 30, so that removing the releasing film 700 does not cause the adhesive 300 to wet spread onto the reflecting sheet 400. The outer surfaces of the light-transmissive member 30 that have been covered by the releasing film 700 will be exposed by removing the releasing film 700. The exposed outer surfaces of the light-transmissive member 30 will be referred to as third outer surfaces 333 and the outer surfaces of the light-transmissive member 30 that are still covered by the reflecting sheet 400 will be referred to as first outer surfaces 331. The outer surfaces of the light-transmissive member 30 that have been exposed before detaching the releasing film 700 will be referred to as second outer surfaces 332.

Covering by Reflecting Material

The second surface 402 of the reflecting sheet 400 and the outer surfaces 33 (the second outer surfaces 332 and the third outer surfaces 333) of the light-transmissive member 30 are covered by the reflecting material 400b (FIG. 8B). Of the outer surfaces 33 of the light-transmissive member 30, the first outer surfaces 331 are covered by the reflecting sheet 400 and the second outer surfaces 332 and the third outer surfaces 333 are covered by the reflecting material 400b.

Exposing First Electrode 251 and Second Electrode 252
Singulating Light Emitting Device 10

The step of exposing the first electrode 251 and the second electrode 252 illustrated in FIG. 8C and the step of singulating the light emitting device illustrated in FIG. 8D are similar to those in the first embodiment and description thereof will be omitted.

The light emitting device 10 (FIG. 8D) manufactured by a method according to the present variation has the third outer surfaces 333 of the light-transmissive member 30 that are made by detaching the releasing film 700, and which differs from the light emitting device 10 according to the first embodiment.

Second Embodiment

Figure 9:
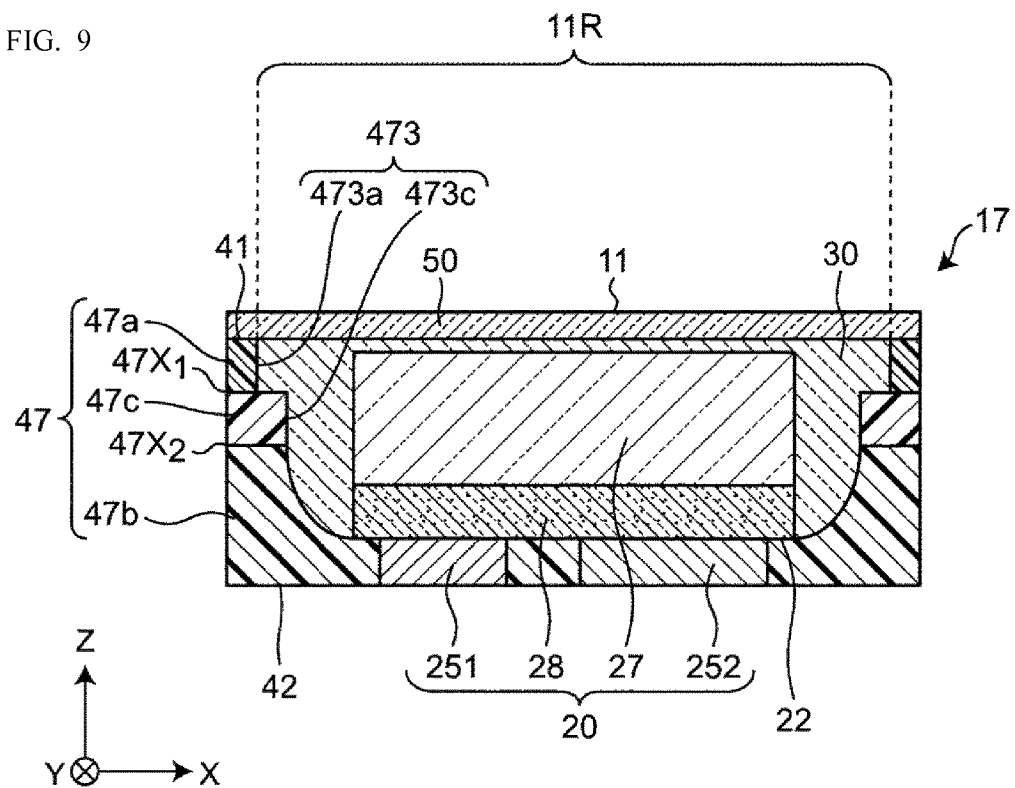
FIG. 9 is a schematic cross-sectional view of a light emitting device according to a second embodiment.

FIG. 9 is a schematic cross-sectional view of a light emitting device according to a second embodiment. The light emitting device 17 according to the second embodiment shown in FIG. 9 differs from the light emitting device 10 (FIG. 2A) according to the first embodiment, in which the reflecting member 47 further includes a third reflecting member 47c between the first reflecting member 47a and the second reflecting member 47b. Other configurations are similar to those in the first embodiment, so that the difference will be mainly described below.

In the reflecting member 17 shown in FIG. 9, the reflecting member 47 includes a first reflecting member 47a at the first surface 41 side, a second reflecting member 47b at the second surface 42 side, and a third reflecting member 47c between the first reflecting member 47a and the second reflecting member 47b. The first reflecting member 47a and the third reflecting member 47c are in contact with each other, and the third reflecting member 47c and the second reflecting member 47b are in contact with each other. The interface $47x_1$ between the first reflecting member 47a and the third reflecting member 47c is preferably a flat surface. The interface $47x_2$ between the third reflecting member 47c and the second reflecting member 47b is preferably a flat surface.

The first inner lateral surfaces 473a of the reflecting member 47a specify a light-emitting region 11R in the light-emitting surface 11 of the light emitting device 17. The second inner lateral surfaces 473c of the third reflecting member 47c are located inward than the first inner lateral surfaces 473a of the first reflecting member 47a, and can be used as a guide for positioning the light emitting element 20 in manufacturing.

In the below, a method of manufacturing a light emitting device 17 will be described with reference to FIG. 10A to FIG. 11E. The steps of disposing an adhesive, disposing light emitting elements, fixing light emitting elements, covering by a reflecting material, exposing first electrodes and second electrodes, and singulating the light emitting devices are similar to those in the first embodiment and description thereof will be omitted, and the steps of providing a reflecting sheet and layering the reflecting sheet and a wavelength-converting sheet will be described below.

Providing Reflecting Sheet 470

Figure 10A:
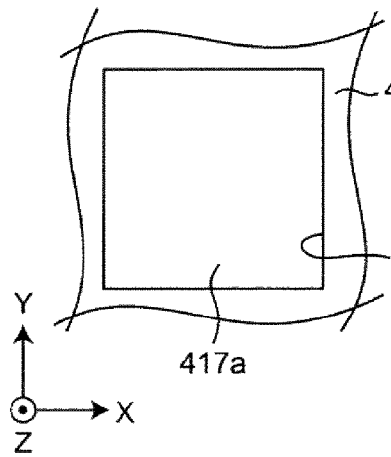
FIG. 10A to FIG. 10C are schematic plan view illustrating a method of manufacturing a light emitting device according to a second embodiment.
Figure 10B:
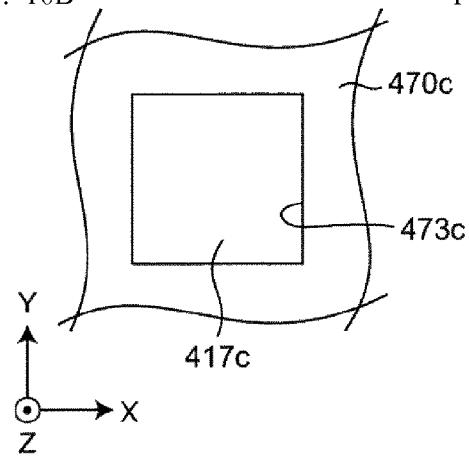
Figure 10C:
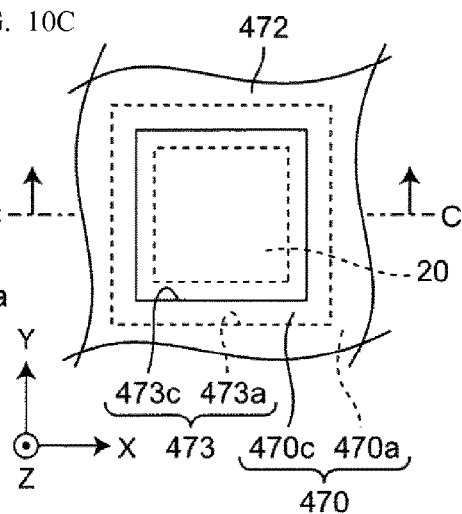
Figure 10D:
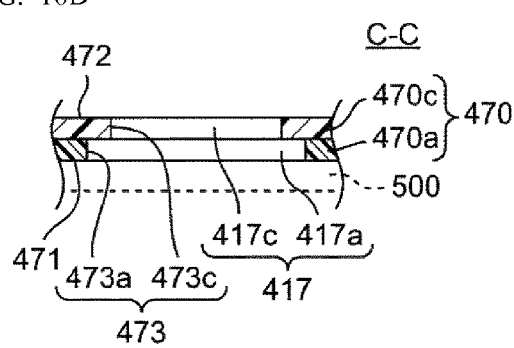
FIG. 10D is a schematic cross-sectional view taken along line C-C of FIG. 10C.

A first reflecting sheet 470a defining first through-holes 417a and a second reflecting sheet 470c defining second through-holes 417c are respectively provided (FIGS. 10A and 10C). The first reflecting sheet 470a and the second reflecting sheet 470c are layered to make a reflecting sheet 470 (FIGS. 10C and 10D). At this time, the first reflecting sheet 470a and the second reflecting sheet 470c are layered so that through-holes 417a and the second through-holes 417c are respectively continuous with each other to form through-holes 417. The reflecting sheet 470 includes the first reflecting sheet 470a at the first surface 471 side and the second reflecting sheet 470c at the second surface 472 side. As shown in FIG. 10D, the surface of the first reflecting sheet 470a and the surface of the second reflecting sheet 470c are relatively flat surfaces, so that the interface between the first reflecting sheet 470a and the surface of the second reflecting sheet 470c also a relatively flat surface.

In the example shown in FIG. 10A and FIG. 10B, the first through-hole 417a and the second through-hole 417c respectively have square openings. At the time of layering the first reflecting sheet 470a and the second reflecting sheet 470c, the first reflecting sheet 470a and the second reflecting sheet 470c are preferably layered so that the centers of the square openings of the through-holes 417a and 417c are overlapped. In the example, a dimension of one side defining the openings is larger in the second through-holes 417c than in through-holes 417a. Thus, when the first reflecting sheet 470a and the second reflecting sheet 470c are layered, the second inner lateral surfaces 473c defining the second through-holes 417c are located inward of the first through-holes 473a defining the first through-holes 417a (FIG. 10C). In the present specification, the term "inward" indicates a direction toward the centers of the through-holes. As shown in FIG. 10D, the inner lateral surfaces 473 defining the through-holes 417 have a step between the first inner lateral surfaces 473a and the second inner lateral surfaces 473c.

Layering Reflecting Sheet 400 and Wavelength-Converting Sheet 500

Figure 10E:
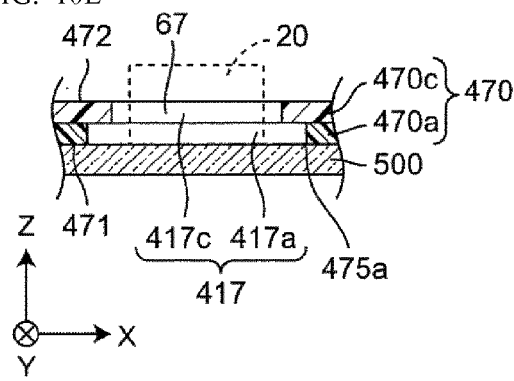
FIG. 10E is a schematic cross-sectional view illustrating a method of manufacturing a light emitting device according to the second embodiment.

A wavelength-converting sheet 500 is provided and the wavelength-converting sheet 500 is layered on the first surface 471 side of the reflecting sheet 470 (FIG. 10E). With this arrangement, the openings (i.e., openings 475a of the first through-holes 417 at the first surface 471 side) of the through-holes 417 at the first surface 471 side are covered by the wavelength-converting sheet 500. Thus, recesses 67 defined by the inner lateral surfaces 473 defining the through-holes 417 and the surface of the wavelength-converting sheet 500 are formed. Each of the recesses 67 is defined so that the bottom surface side (the wavelength-converting sheet 500 side) is wider than the opening side (the second surface 472 side of the reflecting sheet 470). In the step of disposing the light emitting element 20, positioning of the light emitting elements 20 can be facilitated with the recesses 67 defined by narrow opening sides. That is, the second reflecting sheet 470c can serve as a guide facilitating positioning of the light emitting elements 20. Accordingly, the light emitting elements 20 can be placed to the adhesive 300 with good positioning accuracy.

The reflecting sheet 470 and the wavelength-converting sheet 500 may be fixed by an adhesive, for example. If the reflecting sheet 470 or the wavelength-converting sheet 500 or both has tackiness (adhesiveness), the reflecting sheet 470 and the wavelength-converting sheet 500 can be temporary fixed by layering without using an adhesive.

In the step of covering by the reflecting material, the second surface 472 of the reflecting sheet 400 is covered by the reflecting material 400b (FIG. 4A), but the second surface 472 of the reflecting sheet 470 is a relatively flat surface, so that the interface between the reflecting sheet 470 and the reflecting material 400b becomes a relatively flat surface.

Variation

The shape (FIG. 10B) defining the second through-holes 417c of the second reflecting sheet 470c used in the step of providing the reflecting sheet can be changed to a shape having projections 45c such as shown in FIG. 11B. The first reflecting sheet 480a shown in FIG. 11A defines first through-holes 418a defined with a substantially square openings in a top view. The second reflecting sheet 480c shown in FIG. 11B defines through-holes with a substantially square opening by four second inner lateral surfaces 483c each having a protrusion 45c.

The first reflecting sheet 480a and the second reflecting sheet 480c are layered to make a reflecting sheet 480 (FIGS. 11C to 11E). At this time, the first through-holes 418a and the second through-holes 418c are respectively continuous with each other to form through-holes 418. The opening of the first through-holes 418a is smaller than the opening of the second through-holes at locations of the protrusions 45c (FIGS. 11C and 11D), and larger than the opening of the second through-holes at locations absent of the protrusions 45c (FIGS. 1C and 1E). That is, in a top view, the projections 45c of the second reflecting sheet 480c project from the second inner lateral surfaces 483c of the second reflecting sheet 480c located outer side than the first through-holes 418a of the first reflecting sheet 480a further inward than the first inner lateral surfaces 483a defining the first through-holes 418a (FIG. 11C). As described above, a portion (projections 45c) of the second inner lateral surfaces 483c defining the second through-holes 418c is located inward of the first inner lateral surfaces 483a defining the first through-holes 418a, so that in the step of disposing the light emitting elements, the projections 45c can serve as a guide facilitating positioning of the light emitting elements 20 at the time of disposing the light emitting elements 20 in the respective through-holes 418. As shown in FIGS. 11D and 11E, a step is made between the first inner lateral surfaces 483a and the second inner lateral surfaces 483c of the inner lateral surfaces 483 defining the through-holes 418.

Now, the materials suitable for each components used in a method of manufacturing the light emitting device according to the first embodiment and the second embodiment will be described below.

Light Emitting Element 20

For the light emitting element 20, a semiconductor light emitting element such as a light emitting diode can be used. Such a semiconductor light emitting element may include a light-transmissive substrate 27 and a semiconductor layered body 28 formed thereon.

Light-Transmissive Substrate 27

For the light-transmissive substrate 27 of the light emitting element 20, a light-transmissive insulating material such as sapphire ($Al_2O_3$), a semiconductor material (for example, a nitride-based semiconductor material) that allows light from a semiconductor layered body 28 to pass through, or the like, can be used.

Semiconductor Layered Body 28

The semiconductor layered body 28 includes a plurality of semiconductor layers. For example, the semiconductor layered body 28 can include three semiconductor layers of a first conductive-type semiconductor layer (for example, an n-type semiconductor layer) 281, a light emitting layer (an active layer) 282, and a second conductive-type semiconductor layer (for example, a p-type semiconductor layer) 283 (see FIG. 2B). Each of the semiconductor layers can be formed by using a semiconductor material such as a Group III-V compound semiconductor and a Group II-VI compound semiconductor. Specific examples include nitride-based semiconductor materials such as $In_XAl_YGa_{1-X-Y}N$ (0≤X, 0≤Y, X+Y≤1); for example, InN, AlN, GaN, InGaN, AlGaN, InGaAlN, or the like.

Electrode 251, 252

For the electrodes 251, 252 of each of the light emitting elements 20, a good electrical conductor can be used, and for example, a metal such as Cu, Au, Ag, Ni, or Sn is suitable. Each of the first and second electrodes 251, 252 can be made in an appropriate shape. For example, in the light emitting device 10 shown in FIG. 1 and FIGS. 2A and 2B, the electrodes 251, 252 can have a rectangular parallelepiped shape elongated in one direction (e.g., y-direction). The electrodes 251 and 252 do not necessarily have the same shape. Also, the electrodes 251 and 252 can be arranged spaced apart from each other at appropriate locations. As shown in FIG. 1, in certain embodiments, the electrodes 251, 252 are arranged substantially in parallel to each other so that a longitudinal axis of each electrode is aligned in the y-direction.

Adhesive 300 (Light-Transmissive Member 30)

The adhesive 300 is used to fix the light emitting elements 20 in respective through-holes 410 of the reflecting sheet 400, and after being hardened, the adhesive 300 serves as the light-transmissive member 30. The adhesive 300 is particularly preferably a thermosetting light-transmissive resin such as a silicone resin, a silicone-modified resin, an epoxy resin, or a phenol resin. The hardened adhesive 300 (that is, the light-transmissive member 30) is in contact with the lateral surfaces 23 of the light emitting element 20 and easily influenced by heat generated by the light emitting element 20 when lighting. A thermosetting resin has good heat resistant property, so that suitable to the light-transmissive member 30. The light-transmissive member 30 preferably has high light transmissivity. In order to provide desirable properties, an additive may be added to the adhesive 300. For example, in order to adjust the refractive index of the light-transmissive member 30, or to adjust the viscosity of the adhesive 300, various fillers may be added. Addition of an excessive amount of light scattering material will lower the light extraction efficiency, but addition of small amount of light scattering material may improve the light extraction efficiency. Thus, an appropriate amount of light scattering material may be added to the adhesive 300 when needed.

Reflecting Sheet 400, 470, 480 (First Reflecting Member, Third Reflecting Member)

The reflecting sheets 400, 470, or 480 is made of a light-reflecting material formed in a sheet and serves as the first reflecting member or the third reflecting member of the light emitting device. In the present specification, the term "light-reflecting material" refers to a material having a reflectance of 70% or greater to light from the light emitting element 20. For the light-reflecting material, a light-transmissive material having a light-reflecting material dispersed therein can be used, for example. For the light-reflecting material, for example, titanium oxide, silicon dioxide, titanium dioxide, zirconium dioxide, potassium titanate, alumina, aluminum nitride, boron nitride, and mullite can be suitably used. Such a light-reflecting material of granular shape, fibrous shape, flaky shape, or the like can be used. For the light-transmissive material, for example, an inorganic material such as glass material, an organic material such as a resin material can be suitably used. In particular, a resin material is preferable, because that allows easy formation of through-holes 410 in the reflecting sheet by punching or the like. Suitable examples of the resin material include a thermosetting resin such as a silicone resin, a silicone-modified resin, an epoxy resin, and a phenol resin. The first reflecting sheet 470a or 480a and the second reflecting sheet 470c or 480c that make the reflecting sheet 470 or 480 may be made of either the same material or different materials.

Reflecting Material 400b (Second Reflecting Member)

The reflecting material 400b is used for the second reflecting member of the light emitting device and a light-reflecting resin can be used. In the present specification, the term "light-reflecting resin" refers to a resin having a reflectance of 70% or greater to light from the light emitting element 20. For the light-reflecting resin, a light transmissive resin having a light-reflecting material dispersed therein can be used, for example. For the light-reflecting material, for example, titanium oxide, silicon dioxide, titanium dioxide, zirconium dioxide, potassium titanate, alumina, aluminum nitride, boron nitride, and mullite can be suitably used. Such a light-reflecting material of granular shape, fibrous shape, flaky shape, or the like can be used. Suitable examples of the light-transmissive resin include a thermosetting resin such as a silicone resin, a silicone-modified resin, an epoxy resin, and a phenol resin. The reflecting material 400b may be made of either the same material of the reflecting sheet 400, 470, or 480 or different materials.

Wavelength-Converting Sheet 500 (Wavelength-Converting Member 50)

The wavelength-converting sheet 500 is made of a sheet-shaped material that contains a fluorescent material and a light-transmissive material, and serves as a wavelength converting member 50 of the light emitting device 10. For the light-transmissive material, a light-transmissive resin, glass, or the like can be used. Such a layer can be made of More specifically, for example, a silicone resin, an epoxy resin, a phenol resin, a polycarbonate resin, an acrylic resin, a polymethylpentene resin, a polynorbornene resin, or a hybrid resin which contains one or more of those resins are used, and also, a glass may be used. In particular, a silicone resin which has high heat-resisting property and high light-resisting property is preferable.

The fluorescent material that can be excited by light from the light emitting element 20 is used. Specific examples of the fluorescent material that can be excited by the emission of a blue light emitting element or an ultraviolet light emitting element include a yttrium aluminum garnet-based fluorescent material activated with cerium (Ce:YAG), a lutetium aluminum garnet-based fluorescent material activated with cerium (Ce:LAG), a nitrogen-containing calcium aluminosilicate-based fluorescent material activated with europium and/or chromium ($CaO$—$Al_2O_3$—$SiO_2$), a silicate-based fluorescent material activated with europium (($Sr,Ba)_2SiO_4$), a β-sialon-based fluorescent material, nitride-based fluorescent materials such as a CASN-based fluorescent amaterial and a SCASN-based fluorescent material, KSF-based fluorescent material ($K_2SiF_6$:Mn), a sulfide-based fluorescent material, and a quantum dot fluorescent material. With a combination of those fluorescent materials and a blue light emitting element or an ultraviolet light emitting element, light emitting devices of various emission colors (for example, a white light emitting device) can be manufactured.

The wavelength-converting sheet 500 can be used in a semi-hardened state that has tackiness. Accordingly, the reflecting sheet 400 and the wavelength-converting sheet 500 can be temporary fixed by layering without using an adhesive.

Some embodiments according to the present invention have been described above, but the present invention is not limited by those embodiments, and any appropriate embodiments within the gist of the invention can be included.

What is claimed is:

1. A method of manufacturing a light emitting device comprising steps of:
    providing a reflecting sheet having a first surface and a second surface and defining through-holes;
    placing a wavelength-converting sheet on a first surface side of the reflecting sheet to cover openings of the through-holes at the first surface side;
    covering the second surface of the reflecting sheet with a releasing film;
    forming holes in the releasing film such that a shape of openings of the through holes in the releasing film is the same as a shape of openings of the through-holes at a second surface side of the reflecting sheet;
    subsequently, disposing a light-transmissive adhesive in the through-holes of the reflecting sheet;
    disposing a light emitting element in each of the through-holes such that a light emitting surface of the light emitting element faces the wavelength converting sheet and such that the adhesive rises up onto lateral surfaces of each light emitting element;
    fixing the light emitting element in the through-hole via the adhesive;
    subsequently, removing the releasing film from the reflecting sheet; and
    subsequently, covering the second surface of the reflecting sheet and an outer surface of the adhesive with a reflecting material.

2. The method according to claim 1, wherein the step of providing the reflecting sheet comprises punching a reflecting sheet to form the through-holes.

3. The method according to claim 1, wherein inner lateral surfaces defining each of the through-holes in the reflecting sheet widen in a direction from the second surface of the reflecting sheet toward the first surface of the reflecting sheet.

4. The method according to claim 1, wherein the reflecting sheet includes a first reflecting sheet and a second reflecting sheet, and the step of providing the reflecting sheet comprises providing the first reflecting sheet defining first through-holes, providing a second reflecting sheet defining second through-holes, and layering the first reflecting sheet and the second reflecting sheet such that the first through-holes and the second through-holes are continuous with each other.

5. The method according to claim 4, wherein the first reflecting sheet is arranged at the first surface side of the reflecting sheet and the second reflecting sheet is arranged at the second surface side, and at least a portion of inner lateral surfaces defining the second through-holes of the second reflecting sheet is located inward of inner lateral surfaces defining the first through-holes of the first reflecting sheet.

6. The method according to claim 1, wherein, in the step of fixing the light emitting element in each through-hole with the adhesive, each light emitting element is fixed such that a back surface opposite the light emitting surface of the light emitting element is located outside of the through-hole.

7. The method according to claim 1,
    wherein the light emitting element has a first electrode and a second electrode on a back surface opposite the light emitting surface of the light emitting element, and
    the step of covering the second surface of the reflecting sheet and an outer surface of the adhesive with the reflecting material comprises covering the back surface of the light emitting element and the first electrode and the second electrode with the reflecting material, and
    wherein the method further comprises, after the step of covering the second surface of the reflecting sheet and an outer surface of the adhesive with the reflecting material, thinning the reflecting material so as to expose the first electrode and the second electrode.

8. The method according to claim 1,
    wherein in the step of providing the reflecting sheet, a plurality of through-holes are formed in the reflecting sheet, and
    wherein the method further comprises, after the step of covering the second surface of the reflecting sheet and an outer surface of the adhesive with the reflecting material, cutting the reflecting sheet and the reflecting material at locations between adjacent through-holes.

9. A method of manufacturing a light emitting device comprising steps of:
    providing a reflecting sheet having a first surface and a second surface and defining through-holes;
    placing a wavelength-converting sheet on a first surface side of the reflecting sheet to cover openings of the through-holes at the first surface side;
    disposing a light-transmissive adhesive in the through-holes;
    disposing a light emitting element in each of the through-holes such that a light emitting surface of the light emitting element faces the wavelength converting sheet, wherein the light emitting element comprises a first electrode and a second electrode at a back surface of the light emitting element opposite the light emitting surface;
    fixing the light emitting element in the through-hole via the adhesive;
    covering the second surface of the reflecting sheet, an outer surface of the adhesive, and the back surface of the light emitting element, including the first electrode and the second electrode, with a reflecting material; and
    thinning the reflecting material so as to expose the first electrode and the second electrode.

10. The method according to claim 9, wherein the step of providing the reflecting sheet comprises punching a reflecting sheet to form the through-holes.

11. The method according to claim 9, wherein inner lateral surfaces defining each of the through-holes in the reflecting sheet widen in a direction from the second surface of the reflecting sheet toward the first surface of the reflecting sheet.

12. The method according to claim 9, wherein the reflecting sheet includes a first reflecting sheet and a second reflecting sheet, and the step of providing the reflecting sheet comprises providing the first reflecting sheet defining first through-holes, providing a second reflecting sheet defining second through-holes, and layering the first reflecting sheet and the second reflecting sheet such that the first through-holes and the second through-holes are continuous with each other.

13. The method according to claim 12, wherein the first reflecting sheet is arranged at the first surface side of the reflecting sheet and the second reflecting sheet is arranged at the second surface side, and at least a portion of inner lateral surfaces defining the second through-holes of the second reflecting sheet is located inward of inner lateral surfaces defining the first through-holes of the first reflecting sheet.

14. The method according to claim 9, further comprising:
before the step of disposing the light-transmissive adhesive, covering the second surface of the reflecting sheet with a releasing film; and
forming holes in the releasing film such that a shape of openings of the through holes in the releasing film is the same as a shape of openings of the through-holes at a second surface side of the reflecting sheet; and further comprising,
after the step of fixing the light emitting element in each through-hole with the adhesive and before the step of covering a second surface of the reflecting sheet and an outer surface of the adhesive with the reflecting material, removing the releasing film from the reflecting sheet.

15. The method according to claim 9, wherein, in the step of fixing the light emitting element in each through-hole with the adhesive, each light emitting element is fixed such that a back surface opposite the light emitting surface of the light emitting element is located outside of the through-hole.

16. The method according to claim 9,
wherein in the step of providing the reflecting sheet, a plurality of through-holes are formed in the reflecting sheet, and
wherein the method further comprises, after the step of covering the second surface of the reflecting sheet and an outer surface of the adhesive with the reflecting material, cutting the reflecting sheet and the reflecting material at locations between adjacent through-holes.

17. A light emitting device comprising: a light emitting element comprising: a light emitting surface, a back surface opposite the light emitting surface, a plurality of lateral surfaces connecting the light emitting surface and the back surface, and a first electrode and a second electrode at a back surface side of the light emitting element; a light-transmissive member covering at least a portion of the lateral surfaces of the light emitting element and having a first surface at the light emitting surface side of the light emitting element; a reflecting member covering an outer surface of the light-transmissive member and comprising: a first surface at the light emitting surface side of the light emitting element, a second surface opposite the first surface, a first reflecting member at a first surface side of the reflecting member, and a second reflecting member at a second surface side of the reflecting member; and a wavelength converting member covering the light emitting surface of the light emitting element, the first surface of the light-transmissive member, and the first surface of the reflecting member.

18. The light emitting device according to claim 17, wherein the first reflecting member and the second reflecting member are in contact with each other at a flat interface.

19. The light emitting device according to claim 17, wherein the reflecting member further comprises a third reflecting member disposed between and in contact with the first reflecting member and the second reflecting member, wherein the first reflecting member and the third reflecting member are in contact with each other at a flat interface, and wherein the third reflecting member and the second reflecting member are in contact with each other at a flat interface.

* * * * *